US008664080B2

United States Patent
Tani et al.

(10) Patent No.: US 8,664,080 B2
(45) Date of Patent: Mar. 4, 2014

(54) VERTICAL ESD PROTECTION DEVICE

(75) Inventors: Toshiyuki Tani, Hiji-machi (JP);
Hiroshi Yamasaki, Oita Pref (KI);
Kentaro Takahashi, Oita Pref (JP); Lily Springer, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 13/477,792

(22) Filed: May 22, 2012

(65) Prior Publication Data

US 2012/0299146 A1 Nov. 29, 2012

Related U.S. Application Data

(60) Provisional application No. 61/489,723, filed on May 25, 2011.

(51) Int. Cl.
*H01L 29/06* (2006.01)
(52) U.S. Cl.
USPC 438/430; 257/506; 257/E29.02; 257/E21.546; 257/566; 257/591
(58) Field of Classification Search
USPC ............... 257/566, 591, E27.053, E29.02, 257/E21.546; 438/430
See application file for complete search history.

(56) References Cited

U.S. PATENT DOCUMENTS

| | | | | |
|---|---|---|---|---|
| 4,247,859 A | * | 1/1981 | Rai-Choudhury et al. | ... 257/352 |
| 5,243,207 A | * | 9/1993 | Plumton et al. | ............... 257/192 |
| 6,888,214 B2 | * | 5/2005 | Mouli et al. | ................... 257/510 |
| 7,812,367 B2 | * | 10/2010 | Salih et al. | ..................... 257/111 |
| 7,880,223 B2 | * | 2/2011 | Bobde | ............................ 257/328 |
| 2001/0038137 A1 | * | 11/2001 | Akram | .......................... 257/513 |
| 2008/0296629 A1 | * | 12/2008 | Mabuchi | ....................... 257/233 |
| 2011/0121429 A1 | * | 5/2011 | Morillon | ....................... 257/603 |
| 2011/0127586 A1 | * | 6/2011 | Bobde et al. | .................. 257/262 |

* cited by examiner

*Primary Examiner* — Marc Armand
(74) *Attorney, Agent, or Firm* — Jacqueline J. Garner; Wade J. Brady, III; Frederick J. Telecky, Jr.

(57) ABSTRACT

A method for forming a vertical electrostatic discharge (ESD) protection device includes depositing a multi-layer n-type epitaxial layer on a substrate having p-type surface including first epitaxial depositing to form a first n-type epitaxial layer on the p-type surface, and second epitaxial depositing to form a second n-type epitaxial layer formed on the first n-type epitaxial layer. The first type epitaxial layer has a peak doping level which is at least double that of the second n-type epitaxial layer. A p+ layer is formed on the second n-type epitaxial layer. An etch step etches through the p+ layer and multi-layer n-type epitaxial layer to reach the substrate to form a trench. The trench is filled with a filler material to form a trench isolation region. A metal contact is formed on the p+ layer for providing contact to the p+ layer.

14 Claims, 3 Drawing Sheets

VERTICAL ESD PROTECTION DEVICE

CROSS REFERENCE TO RELATED APPLICATIONS

This application claims the benefit of Provisional Application Ser. No. 61/489,723 entitled "A SILICON PROCESS FLOW AND DEVICE STRUCTURE USING TRENCH ISOLATION FOR A VERTICAL ESD DIODE" filed May 25, 2011, which is herein incorporated by reference in its entirety.

FIELD

Disclosed embodiments relate to vertical bidirectional ESD protection devices.

BACKGROUND

Many integrated circuit (IC) products need electrostatic discharge (ESD) protection that can off-load large current and high voltage strikes. Conventional lateral diodes for ESD protection cannot generally carry such large currents, and generally have large footprints.

SUMMARY

Disclosed embodiments include trench isolated vertical bidirectional ESD protection devices and methods for forming the same. In one embodiment a method for forming a vertical electrostatic discharge (ESD) protection device includes depositing a multi-layer n-type epitaxial layer on a substrate having p-type surface including first epitaxial depositing to form a first n-type epitaxial layer on the p-type surface, and second epitaxial depositing to form a second n-type epitaxial layer on the first n-type epitaxial layer. The first n-type epitaxial layer has a peak doping level which is at least double that of the second n-type epitaxial layer. A p+ layer is formed on the second n-type epitaxial layer.

An etching step etches through the p+ layer and multi-layer n-type epitaxial layer to reach the substrate to form a trench. The trench is filled with a filler material to form a trench isolation region. A metal contact is formed on the p+ layer for providing contact to the p+ layer. The bottomside of the substrate can provide the second contact to the vertical ESD protection device. Vertical ESD protection devices having a multi-layer n-type epitaxial layer including a first n-type epitaxial layer and a second n-type epitaxial layer on the first epitaxial layer where the first n-type epitaxial layer has a peak doping level which is at least double that of the second n-type epitaxial layer are also disclosed.

BRIEF DESCRIPTION OF THE DRAWINGS

Reference will now be made to the accompanying drawings, which are not necessarily drawn to scale, wherein.

DETAILED DESCRIPTION

Figure 1:
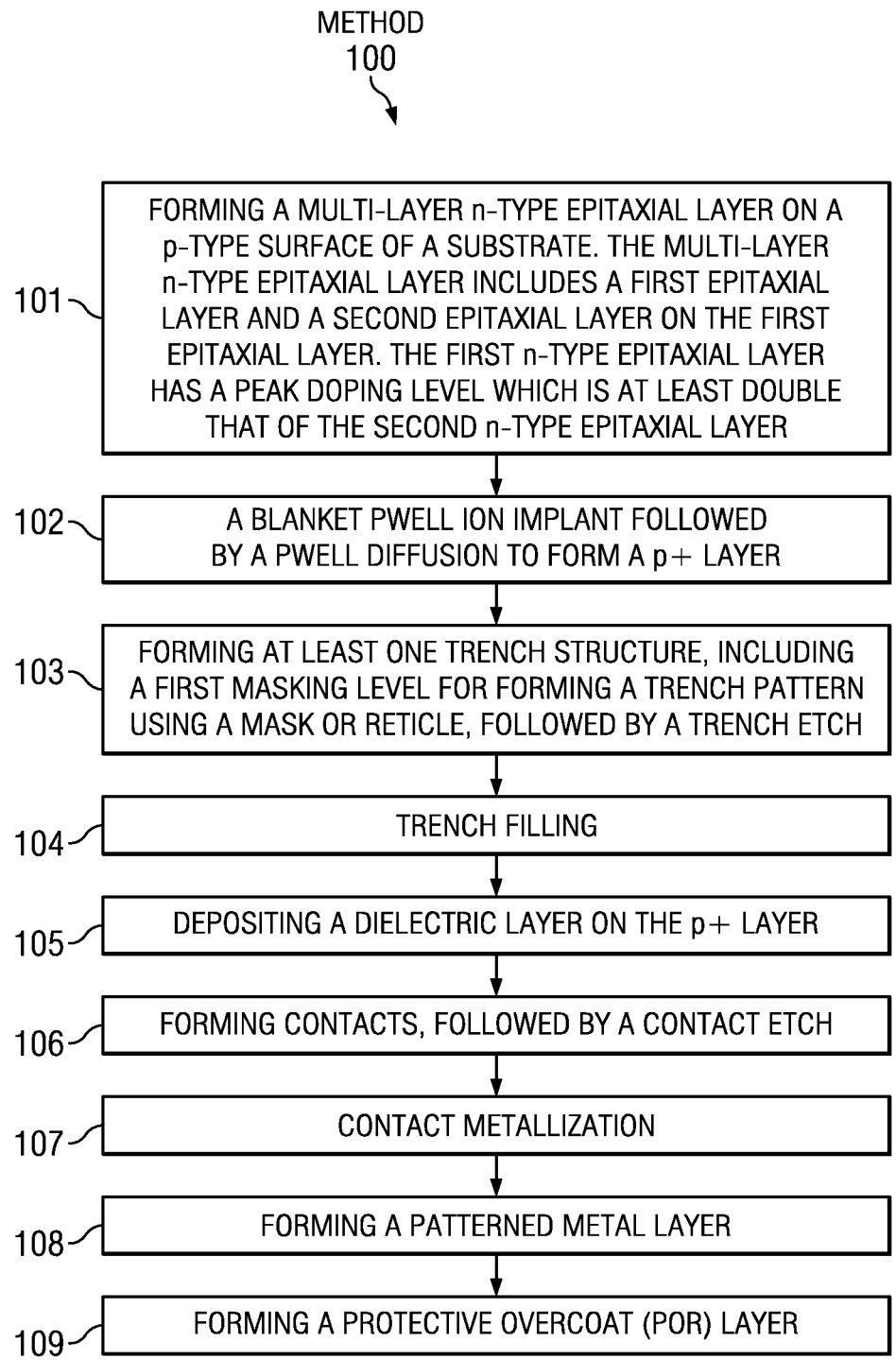
FIG. 1 is a flow chart that shows steps in an example method for forming a vertical ESD protection device having a multi-layer n-type epitaxial layer, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming a vertical ESD protection device having a multi-layer n-type epitaxial layer, according to an example embodiment. Method 100 only involves 4 masks and can be used to form a plurality of stand-alone vertical ESD protection die, with one or more disclosed vertical ESD protection devices per die. Alternatively, disclosed ESD protection devices can be included on an IC die that also has functional circuitry for carrying out a function, such as digital (e.g., logic or processor) application or an analog application, with respective electrodes of disclosed vertical ESD protection devices each providing protection for pins of the IC needing ESD protection.

Step 101 comprises forming a n-type epitaxial layer on a p-type surface of a substrate (e.g., a wafer). The substrate can comprise a bulk p-type silicon comprising substrate, such as bulk silicon or bulk silicon-germanium substrate. The p-type surface can be boron doped and have a concentration from $1 \times 10^{18}$ cm$^{-3}$ to $5 \times 10^{18}$ cm$^{-3}$.

Optionally, a thin pad oxide, followed by silicon nitride deposition and topside nitride etch and thin pad oxide removal can take place before the epitaxial deposition to provide a silicon nitride capping layer on the bottomside of the substrate (e.g., wafer). Silicon nitride on the bottomside of the substrate can prevent boron autodoping from bottomside of the wafer from occurring during formation of the n-type epitaxial layer which can cause counter-doping of the n-type epitaxial layer on the topside of the substrate.

The n-type epitaxial layer provides an n-base for PNP bipolar transistor provided by disclosed vertical ESD protection devices, where the n-dopant can comprise P, As or Sb, and be in a peak doping level range from $1 \times 10^{16}$ cm$^{-3}$ to $3 \times 10^{18}$ cm$^{-3}$. The n-type epitaxial layer can have one or multiple different concentration epitaxial layers. The total thickness of the n-type epitaxial layer is generally from 1.5 μm to 5.0 μm.

For multi-layer n-type epitaxial layer embodiments, the doping level varies layer-to-layer. For a two epitaxial layer embodiment comprising a first epitaxial layer having a second epitaxial layer on the first epitaxial layer, the first n-type epitaxial layer has a peak doping level which is at least double that of the second n-type epitaxial layer. In one embodiment a first n-type epitaxial layer is formed on the p-type surface of a substrate having a peak doping level in a range from $1 \times 10^{17}$ cm$^{-3}$ to $3 \times 10^{18}$ cm$^{-3}$. A second n-type epitaxial layer having a peak doping level in a range is from $1 \times 10^{16}$ cm$^{-3}$ to $5 \times 10^{17}$ cm$^{-3}$ is then formed. As known in epitaxial growth, multiple n-type epitaxial layers can be formed in the same reactor without breaking vacuum, by changing process conditions (i.e. changes to a gas flow of the dopant gas) between respective epitaxial layer depositions.

The peak doping level of the second n-type epitaxial layer is limited to ensure the first n-type epitaxial layer has a peak doping level which is at least double that of the second n-type epitaxial layer. For example, if the peak doping level of the first n-type epitaxial layer is $2 \times 10^{17}$ cm$^{-3}$, the peak doping level of the second n-type epitaxial layer is limited to $1 \times 10^{17}$ cm$^{-3}$.

The breakdown voltage of disclosed vertical ESD protection devices is primarily set by the doping level and dopant distribution in the multi-layer n-type epitaxial layer. As noted above, the multi-layer n-type epitaxial layer forms the n-base of the PNP transistor. The more lightly doped second n-type epitaxial layer (as compared to the first n-type epitaxial layer) controls the depletion layer extension into the multi-layer n-type epitaxial layer during reverse bias under normal operation.

A second pad oxide can then be formed on the n-type epitaxial layer. Step 102 can comprise a blanket pwell implant, which is followed by a pwell diffusion to form a p+ layer. A dielectric deposition on the p+ layer, such as a tetraethoxy-silane (TEOS)-based silicon oxide deposition, can follow the pwell diffusion. Step 103 comprises forming at least one trench which generally form a surrounding (encircling) structure, including a first masking level for forming a trench pattern using a mask or reticle, followed by a trench etch. Step 104 comprises trench filling, such as oxide lined polysilicon filled trenches. Step 105 comprises depositing a dielectric layer, such as borophosphosilicate glass (BPSG; a boron and phosphorous doped glass that flows at a comparatively low temperature, such as 700° C.), followed by an optional dielectric layer densification process.

Step 106 comprises forming contacts, including a second masking level for forming contacts, followed by a contact etch. Step 107 comprises contact metallization. In one particular embodiment the contact metallization comprises a refractory metal layer, such as TiW on Pt. Step 108 comprises forming a patterned metal layer. In one embodiment step 108 comprises an aluminum sputter, then a third masking level for patterning the metal layer followed by a metal etch. Step 109 comprises forming a protective overcoat (POR) comprising a POR deposition, a fourth masking level for patterning the POR layer, followed by a POR etch. Backgrinding can follow step 109, followed by backside metallization, and then probing.

Figure 2A:
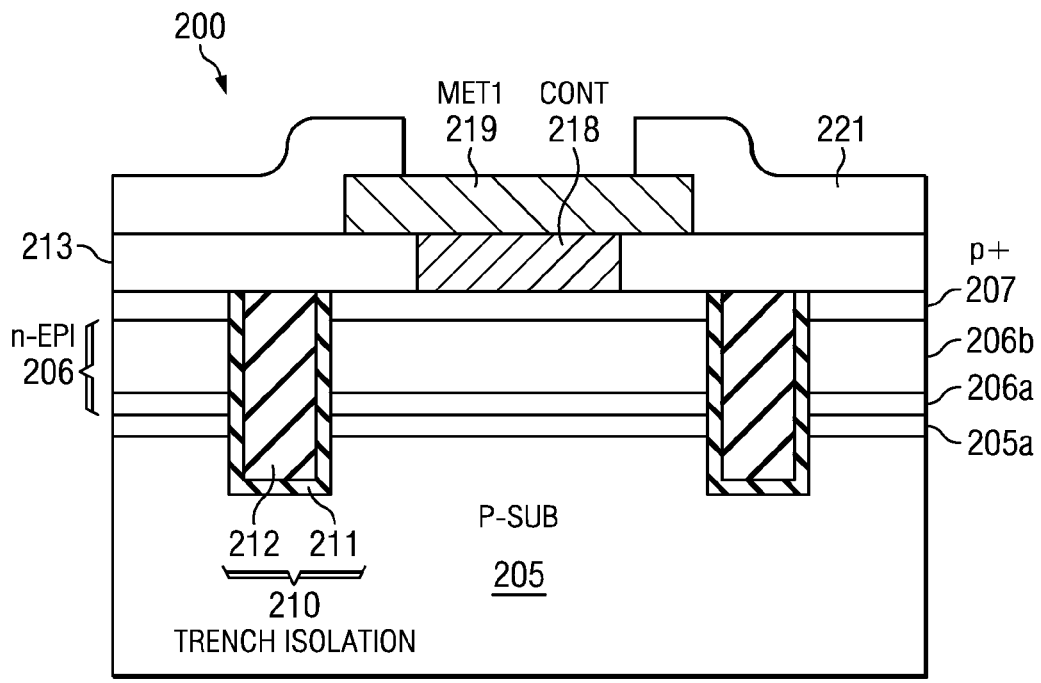
FIG. 2A is a cross-sectional depiction of a disclosed vertical ESD protection device having a multi-layer n-type epitaxial layer including a first (bottom) n-epitaxial layer and a second n-epitaxial layer on the first n-epitaxial layer, according to an example embodiment.

FIG. 2A is a cross-sectional depiction of a disclosed vertical ESD protection device 200 having a multi-layer n-type epitaxial layer 206 that can be seen to provide a vertical PNP bipolar transistor structure, according to an example embodiment. ESD protection device 200 comprises a substrate 205 having a p-type surface 205a. Substrate 205 is shown being a p-type substrate, such as in the case of a bulk p-type silicon substrate that provides a p-type silicon surface 205a. A multi-layer n-epitaxial layer 206 is on the p-type surface 205a of the substrate 205. Multi-layer n-epitaxial layer 206 comprises a first (bottom) n-epitaxial layer 206a and a second n-epitaxial layer 206b on the first n-epitaxial layer 206a. As noted above, the first n-type epitaxial layer 206a has a peak doping level which is at least double that of the second n-type epitaxial layer 206b.

A p+ layer 207 is on the second n-epitaxial layer 206b. P+ layer 207 generally has a peak doping level from $5 \times 10^{18}$ to $2 \times 10^{19}$ cm$^{-3}$. ESD protection device 200 includes trench isolation 210 comprising dielectric liner 211 and a filler material 212 that in one embodiment comprises polysilicon.

A pre-metal dielectric layer 213, such as BPSG, is on the p+ layer 207. The contact metallization for contacting the p+ layer 207 is shown as contact metallization 218. As noted above, contact metallization 218 can comprises TiW on Pt in one particular embodiment. A metal layer 219 is on the contact metallization 218. A patterned POR layer 221 is over the ESD protection device 200 and provides contact to the metal layer 219 which provides a topside contact to ESD protection device 200. A bottomside contact to the ESD protection device 200 (generally having metal thereon) can be provided by the bottomside of substrate 205.

Figure 2B:
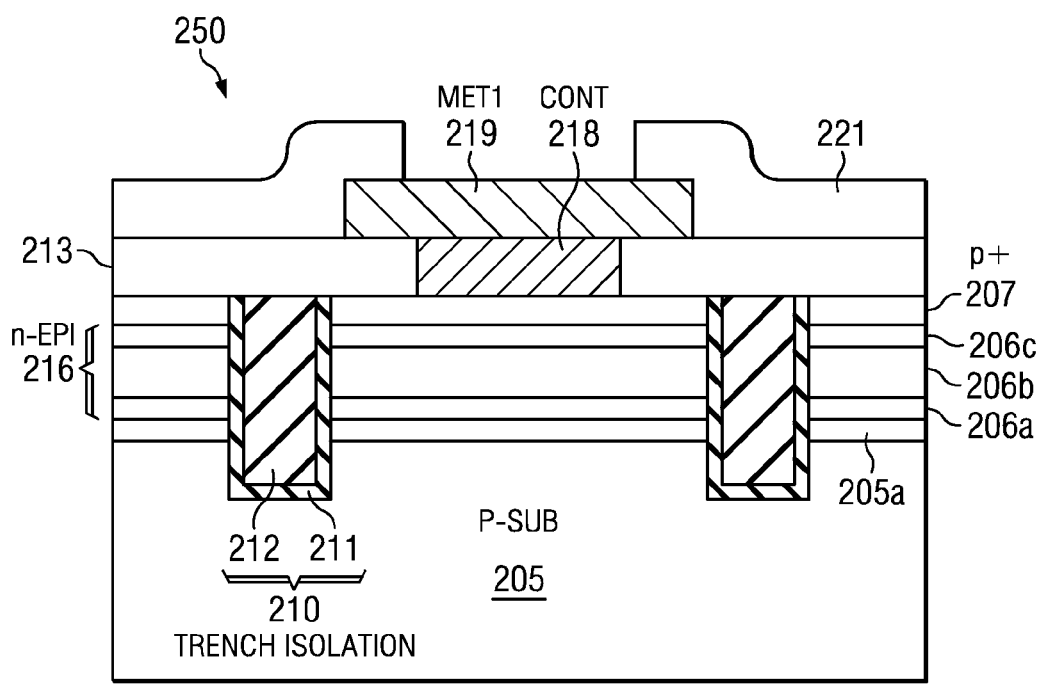
FIG. 2B is a cross-sectional depiction of a disclosed vertical ESD protection device where the multi-layer n-type epitaxial layer comprises a first (bottom) n-epitaxial layer, a second n-epitaxial layer on the first n-epitaxial layer, and a third n-epitaxial layer on the second n-epitaxial layer, according to an example embodiment.

FIG. 2B is a cross-sectional depiction of a disclosed vertical ESD protection device 250 where the multi-layer n-type epitaxial layer 216 comprises a first (bottom) n-epitaxial layer 206a, a second n-epitaxial layer 206b in the first n-epitaxial layer 206a, and a third n-epitaxial layer 206c on the second n-epitaxial layer 206b. In this embodiment the peak doping level of the first and third n-epitaxial layer 206a, 206c are both at least twice the peak doping level of the second n-type epitaxial layer 206b. The three epitaxial layer structure provided by ESD protection device 250 enables obtaining a breakdown voltage lower than 7V at the top PN junction.

Disclosed ESD protection devices can provide a wide range of breakdown voltages enabled by utilizing a multi-layer n-type epitaxial layer including a lightly or moderately doped n-epitaxial layer which forms the n-base for the PNP transistor structure, as opposed to a single very highly doped n-base layer (e.g., a concentration of approximately $\geq 1 \times 10^{20}$ cm$^{-3}$) results in 5 to 6 V of bidirectional breakdown protection with snap-back free performance. For example, a 6V to 22V range with symmetric or asymmetric breakdown characteristics (for example. +−6V or +6V/−14V) has been found to be provided by changing the n-epitaxial layer doping distribution and thickness. Lower n-epitaxial doping levels leads to higher breakdown and lower junction capacitance. Disclosed ESD protection devices typically exhibit a 0.5V to 1.0 V snapback phenomenon.

EXAMPLES

Figures 3A, 3B:
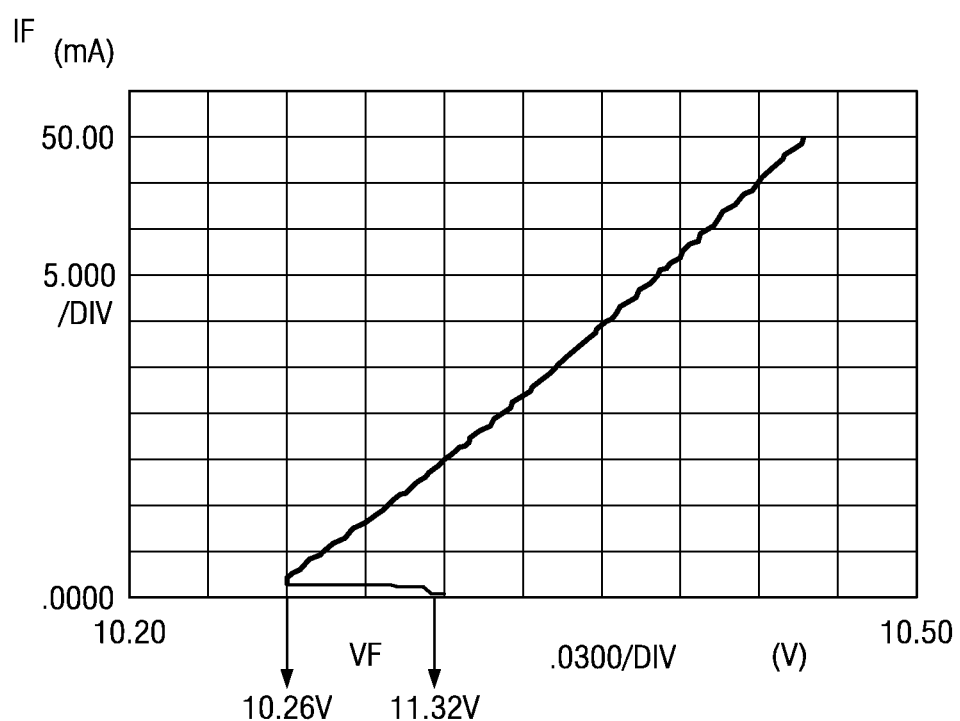
FIGS. 3A and 3B show ESD performance test results from example ESD protection devices analogous to the vertical ESD protection device shown in FIG. 2B formed on a bulk p-type substrate.

Disclosed embodiments are further illustrated by the following specific Examples, which should not be construed as limiting the scope or content of this Disclosure in any way. FIGS. 3A and 3B show ESD performance test results from example ESD protection devices analogous to the vertical ESD protection device 250 shown in FIG. 2B formed on a bulk p-type substrate. The size of ESD protection device 250 evaluated was 182 µm×182 µm. The die thickness was 21 mils (533.4 µm).

FIG. 3A shows the bidirectional ESD performance obtained from the ESD protection device 250 for a 10 zap contact discharge and a 10 zap airgap discharge. The 17 kV level used was only limited by the ESD performance measurement equipment used. The >17 kV level obtained from the relatively small area ESD protection device (182 µm×182 µm) was considered to be good ESD performance.

FIG. 3B shows an example I-V curve from ESD protection device 250. The breakdown voltage can be seen to be at about 11.32V, with a snap back to about 10.26 V, with a 4 ohm Rdyn (dynamic resistance). The 4 ohm Rdyn value obtained was mostly due to the large substrate series resistance due to the 21 mil thickness. It was confirmed in another test that Rdyn was reduced to ≤0.8 ohms when the die thickness was reduced to less than 5 mil (<127 µm).

Disclosed embodiments can be stand-alone devices or be integrated into a variety of process flows to form a variety of different semiconductor integrated circuit (IC) devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method for forming a vertical electrostatic discharge (ESD) protection device, comprising:
    depositing a multi-layer n-type epitaxial layer on a substrate having p-type surface including first epitaxial depositing to form a first n-type epitaxial layer on said p-type surface, and second epitaxial depositing to form a second n-type epitaxial layer formed on said first n-type epitaxial layer, wherein said first n-type epitaxial layer has a peak doping level which is at least double that of said second n-type epitaxial layer, said multi-layer n-type epitaxial layer providing an n-base for a PNP bipolar transistor of said vertical ESD protection device;
    forming a p+ layer on said second n-type epitaxial layer;
    etching through said p+ layer and said multi-layer n-type epitaxial layer to reach said substrate to form a trench;
    filling said trench with a filler material to form a trench isolation region, and
    forming a metal contact on said p+ layer for providing contact to said p+ layer.

2. The method of claim 1, wherein said peak doping level of said first n-type epitaxial layer is in a range from $1\times10^{17}$ cm-3 to $3\times10^{18}$ cm-3 and said peak doping level of said second n-type epitaxial layer is in a range from $1\times10^{16}$ cm-3 to $5\times10^{17}$ cm-3.

3. The method of claim 1, wherein said trench comprises a dielectric lined trench and said filler material comprises polysilicon.

4. The method of claim 1, wherein said multi-layer n-type epitaxial layer is from 1.5 μm to 5.0 μm thick.

5. The method of claim 1, wherein said substrate comprises bulk p-type silicon.

6. The method of claim 1, wherein said forming said p+ layer comprises blanket ion implantation and a peak doping level said p+ layer is from $5\times10^{18}$ to $2\times10^{19}$ cm-3.

7. The method of claim 1, further comprising third epitaxial depositing to form a third n-type epitaxial layer on said second n-type epitaxial layer, wherein said third n-type epitaxial layer has a peak doping level which is at least double that of said second n-type epitaxial layer.

8. A vertical ESD protection device, comprising:
    a substrate having a p-type surface;
    an multi-layer n-type epitaxial layer including a first n-type epitaxial layer on said p-type surface and a second n-type epitaxial layer on said first n-type epitaxial layer; wherein said first n-type epitaxial layer has a peak doping level which is at least double that of said second n-type epitaxial layer, said multi-layer n-type epitaxial layer providing an n-base for a PNP bipolar transistor of said vertical ESD protection device;
    forming a p+ layer on said second n-type epitaxial layer
    a p+ layer on said second n-type epitaxial layer;
    a trench isolation region through said p+ layer and said multi-layer n-type epitaxial layer to reach said substrate filled with a filler material, and
    a metal contact contacting said p+ layer.

9. The vertical ESD protection device of claim 8, wherein said peak doping level of said first n-type epitaxial layer is in a range from $1\times10^{17}$ cm-3 to $5\times10^{18}$ cm-3 and said peak doping level of said second n-type epitaxial layer is in a range from $1\times10^{16}$ cm-3 to $5\times10^{17}$ cm-3.

10. The vertical ESD protection device of claim 8, wherein said trench comprises a dielectric lined trench and said filler material comprises polysilicon.

11. The vertical ESD protection device of claim 8, wherein said multi-layer n-type epitaxial layer is from 1.5 μm to 5.0 μm thick.

12. The vertical ESD protection device of claim 8, wherein said substrate comprises bulk p-type silicon.

13. The vertical ESD protection device of claim 8, wherein said p+ layer is a blanket layer having a peak doping level from $5\times10^{18}$ to $2\times10^{19}$ cm-3.

14. The vertical ESD protection device of claim 8, further comprising a third n-type epitaxial layer on said second n-type epitaxial layer, wherein said third n-type epitaxial layer has a peak doping level which is at least double that of said second n-type epitaxial layer.

* * * * *